United States Patent
Laermer et al.

(10) Patent No.: US 6,677,249 B2
(45) Date of Patent: *Jan. 13, 2004

(54) METHOD FOR MANUFACTURING BREAKAWAY LAYERS FOR DETACHING DEPOSITED LAYER SYSTEMS

(75) Inventors: Franz Laermer, Stuttgart (DE); Wilhelm Frey, Stuttgart (DE); Hans Artmann, Magstadt (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/238,959

(22) Filed: Jan. 27, 1999

(65) Prior Publication Data

US 2001/0055881 A1 Dec. 27, 2001

(30) Foreign Application Priority Data

Jan. 27, 1998 (DE) .......................... 198 03 013

(51) Int. Cl.⁷ ............................................ H01L 21/302
(52) U.S. Cl. .................... 438/745; 438/750; 438/751; 438/753; 438/756; 117/915
(58) Field of Search ................ 438/745, 756, 438/750, 751, 753, 694, 697, 459, 466, 960; 156/230; 117/915

(56) References Cited

U.S. PATENT DOCUMENTS

| | | | | |
|---|---|---|---|---|
| 4,601,779 A | * | 7/1986 | Abernathey et al. | 156/345 |
| 4,883,561 A | * | 11/1989 | Gmitter et al. | 156/345 |
| 4,971,654 A | * | 11/1990 | Schnegg et al. | 156/638 |
| 5,391,257 A | * | 2/1995 | Sullivan et al. | 117/915 |
| 5,453,394 A | | 9/1995 | Yonehara et al. | 438/455 |
| 5,466,631 A | * | 11/1995 | Ichikawa et al. | 438/406 |
| 5,492,859 A | * | 2/1996 | Sakaguchi et al. | 438/459 |
| 5,536,361 A | * | 7/1996 | Kondo et al. | 156/630.1 |
| 5,569,932 A | * | 10/1996 | Shor et al. | 257/3 |
| 5,840,616 A | * | 11/1998 | Sakaguchi et al. | 438/459 |
| 6,100,165 A | * | 8/2000 | Sakaguchi et al. | 438/455 |
| 6,100,166 A | * | 8/2000 | Sakaguchi et al. | 438/455 |
| 6,117,751 A | * | 9/2000 | Schoerner et al. | 438/482 |

FOREIGN PATENT DOCUMENTS

| | | |
|---|---|---|
| EP | 0 797 258 A2 | 9/1997 |
| EP | 0 797 258 A3 | 4/1999 |
| JP | 8-213645 | 8/1996 |

OTHER PUBLICATIONS

H. Takai et al., "Porous Silicon Layers And Its Oxide For The Silicon–on–Insulator Structure", 1986, pp. 222–225.
Nobuhiko Sato et al., "Advanced Quality in Epitaxial Layer Transfer by Bond and Etch–back of Porous Si", 1996, pp. 974–978.

* cited by examiner

Primary Examiner—Nadine G. Norton
Assistant Examiner—Lan Vinh
(74) Attorney, Agent, or Firm—Kenyon & Kenyon

(57) ABSTRACT

A method for removing layers or layer systems from a substrate and subsequent application onto an alternative substrate. A porous breakaway layer is formed by anodization in hydrofluoric acid. Optionally, a stabilizing layer with lower porosity is previously produced on top of the breakaway layer. The oxide of the porous breakaway layer or the stabilizing layer is removed by brief contact with HF, and an epitaxial layer is applied on the porous breakaway layer or the stabilizing layer. The epitaxial layer or the layer system is then removed from the substrate, and the epitaxial layer or the layer system is applied onto an alternative substrate. Optionally, the stabilizing layer and/or residues of the breakaway layer are removed from the epitaxial layer.

12 Claims, 1 Drawing Sheet

METHOD FOR MANUFACTURING BREAKAWAY LAYERS FOR DETACHING DEPOSITED LAYER SYSTEMS

FIELD OF THE INVENTION

The present invention relates to the field of semiconductor technology and, in particular, to a method for detaching layers or layer systems from a carrier substrate and subsequently applying them to an alternative substrate.

BACKGROUND INFORMATION

A detachment of a layer or a layer system from a carrier substrate is known. It is accomplished, for example, by a full chemical dissolution, as well as a mechanical or mechanical-chemical back-thinning of the substrate.

One of the objects of the present invention is to provide a method for detaching layers or layer systems while the substrate is preserved and the layers or layer systems can subsequently be used on other substrates.

SUMMARY OF THE INVENTION

This object is achieved with a method for detaching layers or layer systems from a substrate and subsequently applying them onto an alternative substrate. The method according to the present invention provides that, e.g., a) a porous breakaway layer is formed by anodizing in a hydrofluoric acid;
b) a stabilizing layer with a lower porosity is optionally formed over the breakaway layer;
c) oxide of the breakaway layer or the stabilizing layer is dissolved by a brief contact with the hydrofluoric acid ("HF");
d) an epitaxial layer is applied on the breakaway layer or the stabilizing layer;
e) the epitaxial layer or the layer system composed of the breakaway layer and the stabilizing layer is detached from the substrate;
f) the epitaxial layer or the layer system is applied onto an alternative substrate; and
g) the stabilizing layer and/or the rest of the breakaway layer is detached from the epitaxial layer.

Thus, by producing a breakaway layer in a layer system, a part of this layer system can be detached from the substrate in a controlled manner.

Preferably, p-doped Si, SiC and/or Ge are used as the substrate and as the raw material for the breakaway layer and the stabilizing layer.

Porous silicon, the porous breakaway layer and the low-porosity support layer can be produced by an electrochemical anodizing procedure in a mixture containing hydrofluoric acid (e.g., ethanol). If silicon is used, for example, it is converted to $SiO_2$ in the known manner, which is subsequently made to react with HF.

A porosity of the layers can be adjusted as a function of the current density, doping, and HF concentration.

Since the porosity determines the mechanical and chemical stability of the layer, it can be optimized in this manner. The size of the pores may be in the range of a few nm up to tens of nm. Porosity can also be adjusted in a range of 10% to over 90%. In general, porosity of the porous silicon layer can be increased by increasing current density, reducing HF concentration, and reducing doping. Increasing pore size allows the highly porous layer to be very quickly etched and dissolved selectively with respect to the substrate or a low-porosity layer.

High porosity of the breakaway layer can reduce mechanical stability to the point where the layer on top of the highly porous layer can be mechanically lifted off.

The breakaway layer can have a) a single porosity, b) a sequence of layers having different porosities, or c) a continuous increase and then decrease in the porosity, i.e., a porosity gradient. In the case of the single porosity, a detachment takes place in the breakaway layer or in the abrupt transitions from the low-porosity to the high-porosity layer. In the case of the sequence of layers, several high-porosity breakaway layers with abrupt porosity transitions are created at or in which the layer is ruptured. In the case of the continuous increase and then the decrease in the porosity, a rupture at the porosity transition areas is prevented by the continuous increase and decrease in the porosity, and thus it can only take place in the high-porosity part of the breakaway layer.

Therefore, an additional low-porosity layer made of the same material can be used to stabilize the breakaway layer. This is achieved during an anodization procedure, preferably using a lower current density.

Porous layer systems generally preserve their lattice spacing due to the manufacturing process. However, a lower-porosity layer can be advantageous for a subsequent epitaxial layer to be grown thereon. Thus, the lower-porosity layer not only contributes to stabilizing the entire layer system, but also makes a sufficient number of nuclei available for a possible subsequent epitaxial layer, allowing a high-quality epitaxial layer to grow.

In one embodiment of the method according to the present invention, the breakaway layer is stabilized by a partial oxidation.

This has an advantage that the stability of the layer system is increased in the subsequent separation steps, which are required for applying the epitaxial layer, and the subsequent tempering steps occurring at high temperatures. Prior to applying the epitaxial layer, a brief contact with HF is then required in order to remove the oxide of the layer supporting the epitaxial layer. This contact must be sufficiently short so that while the oxide of the upper low-porosity layer is removed allowing it to then be used as an epitaxial layer, the partly or fully oxidized porous breakaway layer is not yet fully removed.

In another embodiment of the method according to the present invention, a non-wet-chemical oxidation and a subsequent reaction with gaseous HF can be performed with the oxidation product after the partial oxidation.

An advantage of this embodiment is that, e.g., when the high-porosity silicon layers are dried, the resulting capillary forces may become so high that the layers are destroyed. Therefore, the risk of rupture existing with the wet chemical method can be avoided with this embodiment. Thus, the porous layers produced in the anodization remain stable even during the drying process and only lose their mechanical stability by the subsequent HF vapor treatment. In this process step, a loss of stability is desirable because it allows, e.g., layers grown epitaxially to be removed.

A loss of stability of porous silicon is a result of a volume loss and an increase in the internal surface area of silicon. The oxidation step used in this embodiment of the method according to the present invention can be performed by a storage in an oxygen atmosphere or in the air.

The epitaxial layer can be applied by depositing an amorphous layer from the gaseous phase on the breakaway layer or the stabilizing layer and subsequently recrystallizing this amorphous layer by a tempering procedure.

The amorphous layer is deposited from the gaseous phase in a conventional manner using technologies such as PECVE (plasma enhanced chemical vapor epitaxy), MOVPE (metal-organic vapor phase epitaxy), reactive or non-reactive sputtering or PECVD (plasma enhanced chemical vapor deposition).

The amorphous precipitate initially formed is converted to a crystalline form by tempering, the lattice spacing of the underlying layer system forming the basis of the epitaxial layer growth.

The layer grown can be tempered with the entire layer system, including the substrate. It is also possible to temper the layer grown after mechanically removing it. The monocrystalline porous stabilizing layer and thus the nucleus cells required for recrystallization are preserved due to the presence of the breakaway layer. It is also possible to perform a tempering procedure in part with and in part without the substrate.

The epitaxial layer or the layer system can be removed chemically, mechanically, or electrochemically.

Chemically, the porous silicon, for example, is removed using KOH, NaOH, $NH_3$ or mixtures of hydrofluoric acid with oxidants such as $H_2O_2$ or $HNO_3$.

To stabilize the layer to be removed, the upper layer system can be anodically bonded to glass or plastic. The removal process can then be accelerated using ultrasound. Other bonding or gluing methods allow the layer system to be attached to alternative substrates.

Furthermore, the removal can be accomplished electrochemically. This electrochemical removal is only possible when the entire layer system (e.g., including the epitaxial layer) is etched again electrochemically in the hydrofluoric acid. Normally, the hydrofluoric acid cannot penetrate the epitaxial layer to allow electrochemical etching, unless the epitaxial layer is previously structured with holes. In electrochemical removal, a very high current density results in the removal of the upper porous or structured non-porous layer, depending on doping, HF concentration, and the thickness of the breakaway layer.

The method according to the present invention allows layer systems to be advantageously removed from the original substrate and applied to alternative substrates such as glass, plastic or ceramic, or further processed.

A reusability of the substrate allows applications such as electronics on glass or plastic to be implemented in a simpler manner.

Solutions used to remove the breakaway layer can also be used for cleaning the epitaxial layer, i.e., to remove the stabilizing layer and residues of the breakaway layer. One of the objects of the present invention is to manufacture a cleaner removed epitaxial layer.

DETAILED DESCRIPTION

Figure 1:
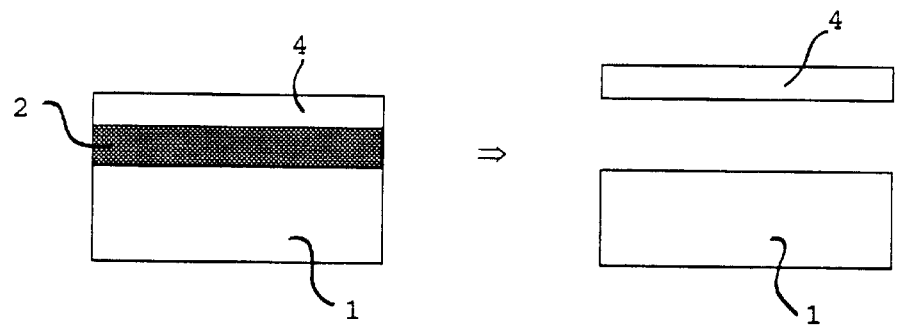
FIG. 1 shows a first layer system before and after removal of a breakaway layer.
Figure 2:
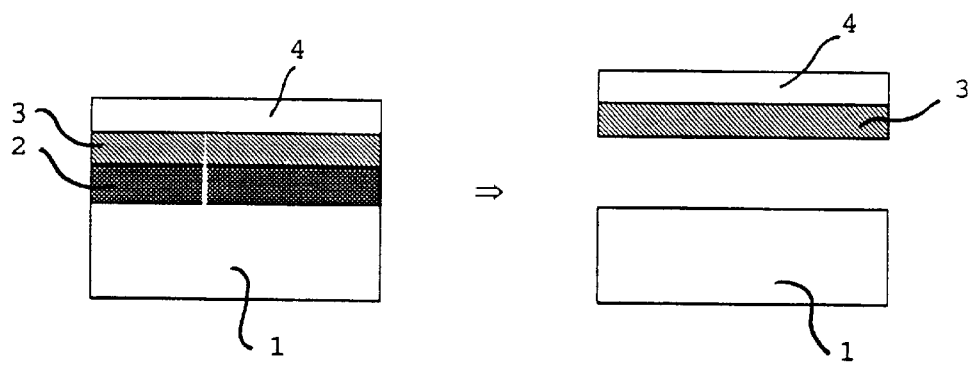
FIG. 2 shows a second layer system before and after removal of the breakaway layer.

Referring to FIG. 1, a breakaway layer 2, which can be covered by stabilizing layer 3 in one embodiment of the present invention (as shown in FIG. 2), is located on a substrate 1. Breakaway layer 2 is composed of a highly porous material. Stabilizing layer 3 is composed of a low-porosity material (e.g., p-doped silicon).

Stabilizing layer 3 is also removed with the etching solutions described above after the removal of breakaway layer 2.

An epitaxial layer 4 grown is located on stabilizing layer 3 and breakaway layer 2.

What is claimed is:

1. A method for removing an epitaxial layer from a first substrate and subsequently applying the epitaxial layer onto a second substrate, the method comprising the steps of:

producing a porous breakaway layer by performing an anodization procedure in a hydrofluoric acid;

removing an oxide layer of the porous breakaway layer that supports the epitaxial layer by contacting the porous breakaway layer with the hydrofluoric acid for a time period without removing the entire porous breakaway layer;

applying the epitaxial layer onto the porous breakaway layer subsequently to the oxide layer removing step, the epitaxial layer being disposed on the first substrate;

removing the epitaxial layer from the first substrate at least one of: chemically by one of KOH, NaOH, $NH_3$ and mixtures of hydrofluoric acid and an oxidant, by ultrasound, and electrochemically, prior to contact with the second substrate; and applying the epitaxial layer onto the second substrate after the epitaxial layer is removed from the first substrate.

2. The method according to claim 1, wherein the first substrate includes at least one of p-doped Si, SiC and Ge; and wherein the porous breakaway layer has a raw material which includes at least one of p-doped Si, SiC and Ge.

3. The method according to claim 1, further comprising the step of:

adjusting at least one of current density, doping and concentration of the hydrofluoric acid to achieve a particular porosity for the porous breakaway layer.

4. The method according to claim 1, wherein the epitaxial layer is chemically removed using at least one of KOH, NaOH, $NH_3$ and a mixture of the hydrofluoric acid having oxidants.

5. The method according to claim 1, further comprising the step of: partially oxidizing the porous breakaway layer to stabilize the porous breakaway layer.

6. The method according to claim 5, wherein the hydrofluoric acid includes a gaseous portion, and further comprising the step of:

after the oxidizing step, performing a non-wet-chemical reaction on the gaseous portion of the hydrofluoric acid using an oxidation product.

7. A method for removing an epitaxial layer from a first substrate and subsequently applying the epitaxial layer onto a second substrate, the method comprising the steps of:

producing a porous breakaway layer by performing an anodization procedure, on the first substrate, in a hydrofluoric acid;

removing an oxide of the porous breakaway layer by contacting the porous breakaway layer with the hydrofluoric acid for a time period;

applying the epitaxial layer onto the porous breakaway layer, the epitaxial layer being disposed on the first substrate;

removing the epitaxial layer from the first substrate at least one of: chemically by one of KOH, NaOH, $NH_3$ and mixtures of hydrofluoric acid and an oxidant, by ultrasound, and electrochemically, prior to contact with the second substrate; and applying the epitaxial layer onto the second substrate after the epitaxial layer is removed from the first substrate; wherein the first applying step includes the substeps of:

(a) removing an amorphous layer from a gaseous phase,
(b) applying the amorphous layer onto the porous breakaway layer, and
(c) after substep (b), recrystallizing the amorphous layer by a tempering procedure.

8. A method for removing one of an epitaxial layer and a layer system from a first substrate to subsequently apply the one of the epitaxial layer and the layer system onto a second substrate, the method comprising the steps of:

(1) producing a porous breakaway layer by performing an anodization procedure in a hydrofluoric acid;

(2) forming a stabilizing layer on top of the porous breakaway layer, a porosity of the stabilizing layer being smaller than a porosity of the porous breakaway layer;

(3) removing an oxide layer of one of the porous breakaway layer that supports the epitaxial layer and the stabilizing layer by contacting the one of the porous breakaway layer and the stabilizing layer with the hydrofluoric acid for a time period without removing the entire porous breakaway layer;

(4) applying the epitaxial layer onto one of the porous breakaway layer and the stabilizing layer subsequent to the oxide layer removing step, the epitaxial layer and the stabilizing layer forming the layer system, at least one of the epitaxial layer and the layer system being disposed on the first substrate;

(5) removing one of the epitaxial layer and the layer system from the first substrate at least one of: chemically by one of KOH, NaOH, $NH_3$, and mixtures of hydrofluoric acid and an oxidant, by ultrasound, and electrochemically, prior to contact with the second substrate; and (6) applying the one of the epitaxial layer and the layer system onto the second substrate after the epitaxial layer is removed from the first substrate.

9. The method according to claim 8, further comprising the step of:
removing at least one of the stabilizing layer and residues of the porous breakaway layer from the epitaxial layer.

10. The method according to claim 8, wherein the first substrate includes at least one of p-doped Si, SiC and Ge; and wherein at least one of the porous breakaway layer and the stabilizing layer has a raw material which includes at least one of p-doped Si, SiC and Ge.

11. The method according to claim 8, further comprising the step of:
adjusting at least one of current density, doping and concentration of the hydrofluoric acid to achieve a particular porosity for at least one of the porous breakaway layer and the stabilizing layer.

12. A method for removing one of an epitaxial layer and a layer system from a first substrate to subsequently apply the one of the epitaxial layer and the layer system onto a second substrate, the method comprising the steps of:

producing a porous breakaway layer by performing an anodization procedure, on the first substrate, in a hydrofluoric acid;

forming a stabilizing layer on top of the porous breakaway layer, a porosity of the stabilizing layer being smaller than a porosity of the porous breakaway layer;

removing an oxide of one of the porous breakaway layer and the stabilizing layer by contacting the one of the porous breakaway layer and the stabilizing layer with the hydrofluoric acid for a time period;

applying the epitaxial layer onto one of the porous breakaway layer and the stabilizing layer, the epitaxial layer and the stabilizing layer forming the layer system, at least one of the epitaxial layer and the layer system being disposed on the first substrate;

removing one of the epitaxial layer and the layer system from the first substrate at least one of: chemically by one of KOH, NaOH, $NH_3$, and mixtures of hydrofluoric acid and an oxidant, by ultrasound, and electrochemically, prior to contact with the second substrate; and applying the one of the epitaxial layer and the layer system onto the second substrate after the one of the epitaxial layer and layer system is removed from the first substrate; wherein the first applying step includes the substeps of:
(a) removing an amorphous layer from a gaseous phase,
(b) applying the amorphous layer onto one of the porous breakaway layer and the stabilizing layer, and
(c) after substep (b), recrystallizing the amorphous layer by a tempering procedure.

* * * * *